United States Patent [19]
Visser

[11] Patent Number: 5,747,362
[45] Date of Patent: May 5, 1998

[54] METHOD OF MANUFACTURING A SEMICONDUCTOR DEVICE IN WHICH A LAYER OF MATERIAL IS DEPOSITED ON THE SURFACE OF A SEMICONDUCTOR WAFER FROM A PROCESS GAS

[75] Inventor: Jan Visser, Eindhoven, Netherlands

[73] Assignee: U.S. Philips Corporation, New York, N.Y.

[21] Appl. No.: 293,105

[22] Filed: Aug. 19, 1994

Related U.S. Application Data

[63] Continuation of Ser. No. 961,760, Oct. 16, 1992, abandoned.

[30] Foreign Application Priority Data

Oct. 18, 1991 [EP] European Pat. Off. ............ 91202701

[51] Int. Cl.$^6$ .................................................. C30B 25/14
[52] U.S. Cl. .................................. 437/225; 204/298.07
[58] Field of Search .......................... 437/225; 118/715, 118/723 E; 204/298.07

[56] References Cited

U.S. PATENT DOCUMENTS 5,213,658  5/1993  Ishida .................. 118/723 E

FOREIGN PATENT DOCUMENTS 0272140  6/1988  European Pat. Off. .
0128518  5/1989  Japan ......................... 118/715
0129974  5/1989  Japan .

*Primary Examiner*—Robert Kunemund
*Attorney, Agent, or Firm*—Steven R. Biren

[57] ABSTRACT

A method of manufacturing a semiconductor device whereby a layer of material (6) is deposited on a surface (3) of a semiconductor wafer (4) from a process gas (5) in a reactor chamber (1) which is kept at a low pressure by means of a pump (2), in which method the wafer (4) is positioned parallel to a gas distribution plate (7) in the reactor chamber (1), so that a planar process space (8) is formed which has a circumferential open connection (9) with the reactor chamber (1), after which the process gas (5) is introduced into the process space (8) through inlet openings (10) in the gas distribution plate (7) while an auxiliary gas (11) is introduced into the reactor chamber (1) around the open connection (9). According to the invention, the auxiliary gas (11) is so introduced into the reactor chamber (1) that a gas pressure is realized in the open connection (9) which is substantially equal to that in the process space (8). The method according to the invention achieves that the process gas (5) in the process space (8) is practically stationary, so that a "stagnant layer" is formed. The process gas (5) in the process space (8) can then be utilized substantially completely for forming the layer (6), so that little process gas (5) is used. In addition, a more uniform layer (6) is obtained owing to the stagnant process gas (5).

4 Claims, 2 Drawing Sheets

METHOD OF MANUFACTURING A SEMICONDUCTOR DEVICE IN WHICH A LAYER OF MATERIAL IS DEPOSITED ON THE SURFACE OF A SEMICONDUCTOR WAFER FROM A PROCESS GAS

This is a continuation of application Ser. No. 07/961,760, filed Oct. 16, 1992, now abandoned. Priority of application Ser. No. 91202701.8, filed on Oct. 18, 1991 in EUROPE, is claimed under 35 U.S.C. 119.

BACKGROUND OF THE INVENTION

The invention relates to a method of manufacturing a semiconductor device whereby a layer of material is deposited on a surface of a semiconductor wafer from a process gas in a reactor chamber which is kept at a low pressure by means of a pump, in which method the wafer is arranged parallel to a gas distribution plate in the reactor chamber so that a planar process space is formed which has a circumferential open connection with the reactor chamber, after which the process gas is introduced into the process space through inlet openings in the gas distribution plate while around the open connection an auxiliary gas is introduced into the reactor chamber.

By means of such a method—also called "Chemical Vapour Deposition" (CVD)—for example, layers of polycrystalline silicon, silicon oxide, silicon nitride, but also layers of tungsten, tungsten silicide and titanium silicide and nitride may be deposited. The process gas may be a single gas, but often it is a gas mixture. The layers mentioned above may be deposited from, for example, a process gas of silane, tetraethoxysilane (TEOS), a gas mixture with dichlorosilane and ammonia, a gas mixture with tungsten hexafluoride and hydrogen or silane, a gas mixture with titanium dichloride and dichlorosilane, and a gas mixture with tetradimethyl aminotitanium and ammonia, respectively.

EP-A-272140 discloses a method of the kind mentioned in the opening paragraph in which the process gas is introduced into the process space between the semiconductor wafer and the gas distribution plate, after which it flows over the wafer into the reactor chamber. The layer of material is then deposited from this flowing process gas. The auxiliary gas, which is introduced around the open connection between the process space and the reactor chamber, is, for example, helium or nitrogen and has the object of diluting gas remnants flowing from the process space into the reactor chamber to such an extent that no material deposition takes place in the reactor chamber.

The known method described has the disadvantage that in practice only approximately one tenth of the supplied process gas is converted into deposited material.

Nine tenths of the process gas, accordingly, are removed by the pump without being used. Since this gas is mixed with the auxiliary gas and with other gases which are formed in the process space, this gas must be given up as lost. This is an undesirable situation especially when expensive gases, such as tungsten hexafluoride and tetradimethyl aminotitanium, or toxic gases, such as silane or ammonia, are used.

SUMMARY OF THE INVENTION

The invention has for its object inter alia to counteract this disadvantage.

According to the invention, the method is for this purpose characterized in that the auxiliary gas is introduced into the reactor chamber in such a way that in the open connection a gas pressure is realised which is substantially equal to that in the process space. It is achieved by this that the process gas in the process space is practically stagnant. The process gas in the process space can then be substantially completely used for forming the layer, so that comparatively little process gas is used, whereby the cost of the process gas itself and of cleaning of the exhaust gases is comparatively low. In addition, substantially no process gas enters the reactor chamber, so that the latter is not polluted by material deposition and possible loose particles of material. Since there is substantially no pressure difference in the process space, the layer will also have a more uniform thickness.

The invention is based on the recognition that transport of a substance in a stagnant medium can take place through diffusion. A chemical reaction takes place at the surface of the wafer. In this reaction the process gas is converted into the material, which is deposited as a layer on the surface, and into gaseous reaction products which are to be removed. The concentration of the process gas will be low near the surface of the wafer because of the conversion, and accordingly transport of process gas towards the surface of the wafer will take place through diffusion from the remainder of the process space where the concentration of the process gas is higher. Near the surface of the wafer, the concentration of the gaseous reaction products will be higher than in the remainder of the process space or at the open connection, so that transport of the gaseous reaction products from the surface to the remainder of the process space and the open connection will take place. The gaseous reaction products are introduced into the reactor chamber at the open connection and discharged to the pump. The concentration of the gaseous reaction products at the open connection, therefore, will be lower than in the process space, so that also the gaseous reaction products in the process space will be discharged towards the open connection through diffusion.

At the outer edge of the wafer, the process gas can diffuse from the inlet openings both towards the surface of the wafer and to the open connection, as in fact, the concentration of the process gas in both these locations is comparatively low. As a result, the concentration of process gas at the edge of the wafer may be somewhat lower than in the center of the wafer, and a somewhat lower deposition of material could take place at the edge. Preferably, the method according to the invention is characterized in that a ring projecting around and beyond the wafer is used, which ring immediately adjoins the wafer and forms a prolongation of the process space in conjunction with the gas distribution plate. Owing to the prolongation, the open connection of the process space with the reactor chamber is farther away from the outer edge of the wafer, so that more process gas diffuses towards the wafer. Preferably, the prolongation of the process space has a length which is greater than a distance between the gas distribution plate and the wafer. It is achieved by this that process gas diffusing from inlet openings near the edge of the wafer over the prolongation towards the open connection must travel a longer path than process gas diffusing directly to the wafer. More process gas will then be present at the edge of the wafer, so that the thickness of the provided layer is more uniform. Preferably, the ring is also used as a holder for the wafer, so that a mechanically simple construction is obtained.

Preferably, a gas distribution plate with homogeneously distributed inlet openings is used for supplying the process gas. Differences in diffusion of the process gas from the inlet openings to the surface of the wafer are then averaged out. The layer of material will then be given the most homogeneous thickness on the basis of a given number of inlet openings.

In principle, the auxiliary gas may be introduced into the reactor chamber in any position. Preferably, the auxiliary gas is introduced into the reactor chamber through a tube which runs around the open connection and is provided with openings throughout its circumference. A homogeneous pressure is thus obtained around the open connection, while the method can be implemented in a simple manner by means of a usual gas distribution plate.

BRIEF DESCRIPTION OF THE DRAWING

The invention is explained in more detail below with reference to the drawing, by way of example. In the drawing.

The Figures are purely diagrammatic and not drawn to scale. Corresponding parts have generally been given the same reference numerals in the Figures.

DESCRIPTION OF THE PREFERRED EMBODIMENTS

Figure 1:
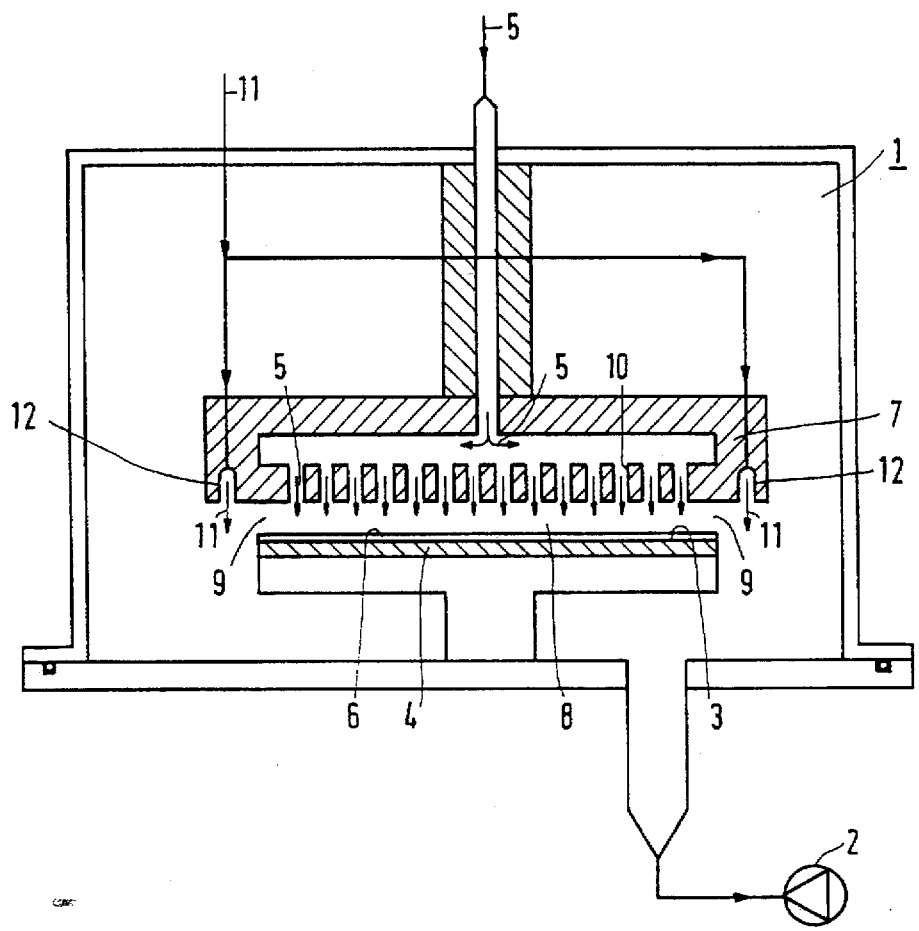
FIG. 1 shows a system for the manufacture of a semiconductor device by the method according to the invention.

FIG. 1 diagrammatically shows a device for carrying out a method of manufacturing a semiconductor device, in which a layer of material 6 is deposited from a process gas 5 on a surface 3 of a semiconductor wafer 4 in a reactor chamber 1, which is kept at a low pressure by a pump 2. Such a method is called "Chemical Vapour Deposition" (CVD). The device shown is designed for providing layers of, for example, semiconductors or metals, or the oxides, silicides, carbides or nitrides thereof. The process gas may be a single gas, but often it is a gas mixture. Thus, titanium nitride is deposited from a gas mixture of tetradimethyl aminotitanium and ammonia. According to the method, the wafer 4 is positioned in the reactor chamber 1 parallel to a gas distribution plate 7, so that a planar process space 8 is formed which has a circumferential open connection 9 with the reactor chamber 1, after which the process gas 5 is introduced into the process space 8 through inlet openings 10 in the gas distribution plate 7, while an auxiliary gas 11 is introduced into the reactor chamber 1 around the open connection 9.

The pressure in the reactor chamber 1 during this has a value of between approximately 0.1 and 200 torr. The planar process space 8 is formed in that the semiconductor wafer 4 is positioned parallel to and at a distance of approximately 0.5 to 1 cm from the round gas distribution plate 7 which has a diameter of, for example, approximately 17 cm, while the wafer has a slightly smaller diameter of, for example, 15 cm. The gas distribution plate 7 is provided with, for example, 3400 inlet openings 10 with a diameter of approximately 0.75 mm distributed over a surface of the gas distribution plate opposite the wafer 4, thus forming a so-called "shower head". The process gas 5 is introduced into the process space 8 through the inlet openings 10. If several process gases are used, the individual gases may be supplied through separate inlet openings 10. Means 12 are used for supplying an auxiliary gas 11 around the open connection 9. The means 12 comprise approximately 100 supply holes distributed over the circumference of the gas distribution plate 7. The auxiliary gas 11 is then removed by the pump 2. The auxiliary gas 11 ensures that the process gas 5 which is discharged from the process space 8 is diluted, so that practically no deposition of material takes place in the reactor chamber 1 outside the wafer 4.

It is a known procedure to have the process gas 5 flow over the semiconductor wafer 4 in such a way that only approximately one tenth of the process gas is utilized for providing the layer 6. Nine tenths of the process gas 5 are accordingly discharged towards the pump 2 through the open connection 9 of the process space 8 without being used. Since this gas has been mixed with the auxiliary gas 11 in the reactor chamber and with gaseous reaction products formed in the process space, this gas must be given up as lost. This is an undesirable situation, especially where expensive gases—such as tungsten hexafluoride and tetradimethyl aminotitanium—or toxic gases—such as silane or ammonia—are used. In addition, a comparatively large quantity of process gas 5 enters the reactor chamber 1, which may give rise to problems concerning the formation of material particles in the reactor chamber 1, in spite of dilution by means of the auxiliary gas 11. Furthermore, the process gas 5 can only flow because the gas pressure varies locally. As a result, the layer 6 will not have a completely uniform thickness.

According to the invention, the auxiliary gas 11 is introduced into the reactor chamber in such a manner that a gas pressure is realised in the open connection 9 which is practically equal to that in the process space 8. The process gas 5 in the process space 8 is then substantially stationary, or, in other words, the gas forms a so-called "stagnant layer". The process gas 5 can then be used practically completely for forming the layer 6, so that comparatively little process gas 5 is used, so that the cost of the process gas itself and of cleaning of the discharged gases is relatively low. In addition, practically no process gas 5 enters the reactor chamber 1, so that the latter is not polluted by particles. Since there is practically no pressure differential in the process space 8, the layer 6 will also have a uniform thickness. The transport of the process gas 5 and the removal of gaseous reaction products takes place through diffusion. Because of the planar shape of the process space 8 and the positions of the inlet openings 10, the process gas 5 has only a comparatively short distance to cover in order to diffuse towards the surface 3 of the wafer 4. The gaseous reaction products diffuse to the open connection 9, where they are diluted with the auxiliary gas 11 and discharged towards the pump 2.

Figure 2:
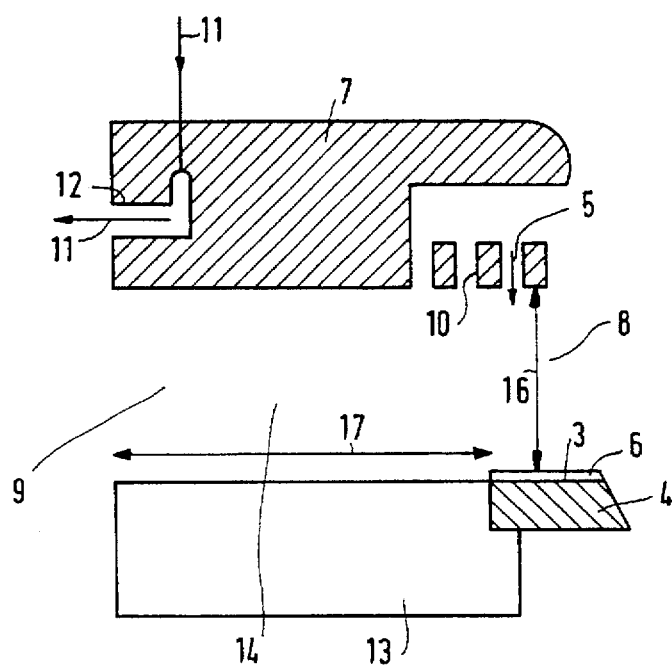
FIG. 2 is a detailed drawing of the open connection between the process space and the reactor chamber of the system, as used in an embodiment of the method according to the invention.

At the outer edge of the wafer 4, the process gas 5 can diffuse from the inlet openings 10 both to the surface 3 of the wafer 4 and to the open connection 9 of the planar process space 8. This is because the concentration of the process gas is comparatively low in both locations. FIG. 2 shows how a ring 13 is used which lies against the wafer 4 and projects from it all around, and which forms an extension the process space 8 in conjunction with the gas distribution plate 7. As clearly shown in FIG. 2, the upper surface of ring 13 is substantially coplanar with the upper surface of the wafer 4. Owing to the extension 14, the open connection 9 of the process space 8 with the reactor chamber 1 lies further away from the outer edge of the wafer 4. Preferably, the extension 14 of the process space has a length 17 which is greater than a distance 16 between the gas distribution plate 7 and the wafer 4. It is achieved by this that sufficient process gas 5 diffuses to the outer edge of the wafer 4 from inlet openings 10 near the outer edge of the wafer 4, so that the thickness of the layer 6 provided is more uniform. Preferably, there are no inlet openings 10 for the process gas 5 in the extension 14, or only few near the outer edge of the wafer 4. In this way, only a small quantity of the process gas 5 is discharged to the pump 2 through the open connection 9. Preferably, the ring 13 is used at the same time as the wafer support, so that the mechanical construction is simple.

Diffusion from the inlet openings 10 to the surface 3 of the wafer 4 plays a part in the method according to the invention. This is in contrast to the known method, where the process gas 5 flows over the wafer 4 and where often a different gas distribution plate 7 is required for a different deposition process because of differences in flow characteristics of the process gas 5. Preferably, a gas distribution plate 7 with homogeneously distributed inlet openings 10 is used for providing the process gas 5 in a method according to the invention. In this manner the layer of material 6 will have the most homogeneous thickness for a given number of inlet openings 10.

Figure 3:
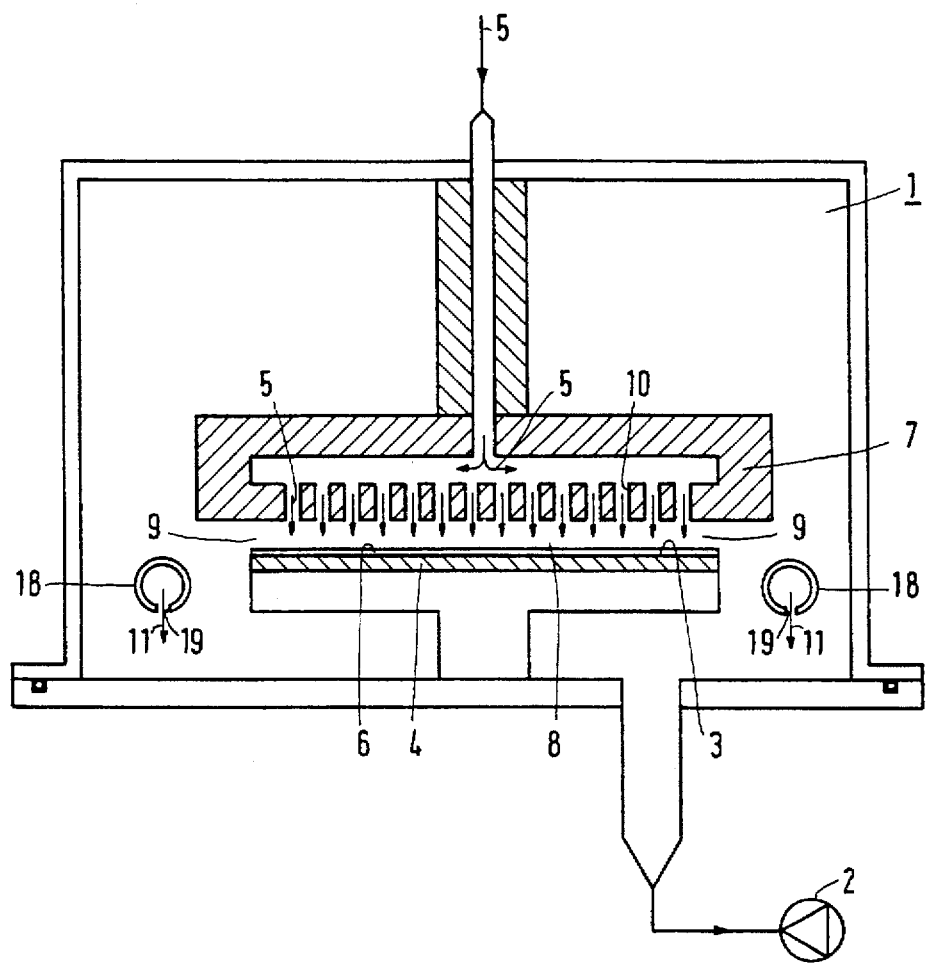
FIG. 3 shows a system for the manufacture of a semiconductor device by the method according to the invention, where the auxiliary gas is introduced into the reactor chamber through a tube running around the open connection.

In principle, the auxiliary gas 11 may be introduced into the reactor chamber 1 in any location, for example, through openings 12 in the gas distribution plate 7 (see FIGS. 1, 2). Preferably, the auxiliary gas 11 is introduced into the reactor chamber through a tube 18 which runs around the open connection and is provided with openings 19 for the auxiliary gas 11 throughout its circumference (see FIG. 3). A homogeneous pressure is obtained around the open connection 9 in this manner, while the method can be used in a simple manner by means of a usual gas distribution plate 7.

EMBODIMENT 1

Deposition of a Tungsten Layer

A layer 6 of tungsten is deposited from a process gas 5 comprising tungsten hexafluoride ($WF_6$) and hydrogen ($H_2$). The deposition is based on the reduction of the $WF_6$ by the $H_2$:

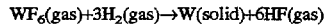

$$WF_6(gas) + 3H_2(gas) \rightarrow W(solid) + 6HF(gas)$$

The W forms the layer of material 6 and the HF is discharged as the gaseous reaction product. A gas distribution plate 7 of 17 cm in diameter is used with 3400 inlet openings. The inlet openings are divided into two groups, a different process gas being blown into the process space through each group. A semiconductor wafer 4 with a diameter of approximately 15 cm and a surface area of approximately 200 cm² is mounted on a ring 13 having a width of 1 cm at a distance of 0.5 cm from the gas distribution plate 7. A tube 18 with a diameter of 1 cm is provided around the open connection at a distance of 2 cm from the outer edge of the wafer 4. The tube is provided with 100 supply openings 19 for the supply of an argon auxiliary gas 11. In the process space, 15 sccm $WF_6$ and 100 sccm $H_2$ are supplied through the two groups of inlet openings 10. The reduction of $WF_6$ to W takes place at 430° C. at a gas pressure in the process space of 10 torr. A gas pressure of 10 torr is maintained in the open connection 9 by means of the supply of argon through supply openings 19 in the tube 18. 600 nm tungsten per minute is then deposited on the semiconductor wafer 4. The auxiliary gas 11 discharged from the reactor chamber is substantially unpolluted with $WF_6$, while the consumption of $WF_6$ amounts to approximately 10% of the consumption in known methods.

I claim:

1. A method of manufacturing a semiconductor device, comprising depositing a layer of material on a surface of a semiconductor wafer from a process gas in a reactor chamber which is kept at low pressure by a pump, arranging the wafer parallel to a gas distribution plate in the reactor chamber to form a planar process space which has a circumferential open connection with the reactor chamber, then introducing the process gas into the process space through inlet openings in the gas distribution plate, and introducing an auxiliary gas into the reactor chamber around the open connection to create in the open connection a gas pressure which is substantially equal to that in the process space, providing a ring projecting around and beyond the wafer and aligning an upper surface of said ring substantially coplanar with said surface of the wafer, said ring being provided adjoining the wafer and forming a lateral prolongation of the process space in conjunction with the gas distribution plate, and providing the prolongation of the process space with a length which is greater than a distance between the gas distribution plate and the wafer.

2. A method as claimed in claim 1, characterized in that the ring is also used as a holder for the wafer.

3. A method as claimed in claim 1, characterized in that a gas distribution plate with homogeneously distributed inlet openings is used for supplying the process gas.

4. A method as claimed in claim 1, characterized in that the auxiliary gas is introduced into the reactor chamber through a tube which runs around the open connection and is provided with openings throughout its circumference.

* * * * *